(12) United States Patent
Koo (10) Patent No.: US 7,696,518 B2
(45) Date of Patent: Apr. 13, 2010

(54) FLAT PANEL DISPLAY WITH ANODE ELECTRODE LAYER AS POWER SUPPLY LAYER AND FABRICATION METHOD THEREOF

(75) Inventor: Jae-Bon Koo, Yongin (KR)

(73) Assignee: Samsung Mobile Display Co., Ltd., Giheung-Gu, Yongin, Gyunngi-Do (KR)

( * ) Notice: Subject to any disclaimer, the term of this patent is extended or adjusted under 35 U.S.C. 154(b) by 1687 days.

(21) Appl. No.: 10/764,525

(22) Filed: Jan. 27, 2004

(65) Prior Publication Data

US 2004/0183083 A1 Sep. 23, 2004

(30) Foreign Application Priority Data

Feb. 5, 2003 (KR) .................. 10-2003-0007288

(51) Int. Cl.
*H01L 29/00* (2006.01)
(52) U.S. Cl. .................. 257/72; 257/E27.113
(58) Field of Classification Search .......... 257/93, 257/72, E27.113
See application file for complete search history.

(56) References Cited

U.S. PATENT DOCUMENTS

| | | | | |
|---|---|---|---|---|
| 6,724,149 B2 * | 4/2004 | Komiya et al. | ............ | 315/169.3 |
| 6,762,564 B2 * | 7/2004 | Noguchi et al. | ........... | 315/169.1 |
| 6,798,405 B2 * | 9/2004 | Anzai | ........................... | 257/59 |
| 6,825,496 B2 * | 11/2004 | Yamazaki et al. | ............. | 257/72 |
| 7,230,591 B2 * | 6/2007 | Inukai | ........................ | 345/76 |
| 2003/0111954 A1 * | 6/2003 | Koo et al. | ................... | 313/498 |
| 2003/0117083 A1 * | 6/2003 | Koyama | ................. | 315/169.3 |

FOREIGN PATENT DOCUMENTS

| | | |
|---|---|---|
| CN | 1369872 | 9/2002 |
| JP | 09-160509 | 6/1997 |

(Continued)

OTHER PUBLICATIONS

*Japanese Office action in the Japanese patent application* No. 2003-354515 *mailed* Apr. 15, 2008.

(Continued)

*Primary Examiner*—W. David Coleman
*Assistant Examiner*—Sun M Kim
(74) *Attorney, Agent, or Firm*—Robert E. Bushnell, Esq.

(57) ABSTRACT

A flat panel display capable of preventing inline short between adjacent wirings and voltage drop through power supply line by using pixel electrode layer as a power supply layer, and a fabrication method thereof. A flat panel display of the present invention is made up of a thin film transistor including source/drain electrodes, formed on an insulation substrate, an insulation film formed on the insulation substrate including the thin film transistor and including first and second contact holes for exposing the source/drain electrodes respectively, a pixel electrode formed on the insulation film and connected to one of the source/drain electrodes through one of the first and second contact holes, and a power supply layer formed on the insulation film and connected to the other one of the source/drain electrodes through the other one of the first and second contact holes. Losses in the power supply line is reduced by forming the power supply line of a low resistivity material and by providing the power supply line in a grid structure.

11 Claims, 6 Drawing Sheets

FOREIGN PATENT DOCUMENTS

| | | |
|---|---|---|
| JP | 11-126691 | 5/1999 |
| JP | 2001-134214 | 5/2001 |
| JP | 2001-332383 | 11/2001 |
| JP | 2002-32037 | 1/2002 |
| JP | 2003-15548 | 1/2003 |
| JP | 2003-17273 | 1/2003 |
| JP | 2003015548 A * | 1/2003 |

OTHER PUBLICATIONS

Japanese Office action corresponding to Japanese Patent Application No. JP2003-354515, issued on Apr. 10, 2007.

Korean Office action for Korean patent application No. 10-2003-0007288 issued on Apr. 20, 2005.

Certificate of Patent from the Chinese Patent Office issued in Applicant's corresponding Chinese Patent Application No. 200410033069.0 dated Dec. 31, 2008.

* cited by examiner

FLAT PANEL DISPLAY WITH ANODE ELECTRODE LAYER AS POWER SUPPLY LAYER AND FABRICATION METHOD THEREOF

CLAIM OF PRIORITY

This application claims the benefit of Korean Patent Application No.2003-7288, filed on Feb. 5, 2003, under 35 U.S.C. §119, the entirety of which is hereby incorporated by reference.

BACKGROUND OF THE INVENTION

1. Field of the Invention

The present invention relates to a flat panel display, more particularly, to an organic electroluminescent display device capable of preventing inline short and voltage drop on a power supply layer by having the power supply layer and an anode electrode layer formed simultaneously and on the same layer while forming the power supply layer on a different layer than on the layers the data and gate lines are formed.

2. Description of Related Art

Typically, each pixel of an active matrix organic electroluminescent display device includes a switching transistor, a driving transistor, a capacitor, an EL (or an electro-luminescence) device, and a power supply line. The power supply line delivers common power (Vdd) to the driving transistor and the capacitor. Preferably, a common power should be uniformly supplied to each and every pixel in the matrix to obtain uniform luminance for each pixel. The design of the power supply line plays a role in controlling current flowing to each of the EL devices in the matrix through the respective driving transistor.

The EL device is made up of an anode (or pixel) electrode, a cathode electrode and an EL (or light emitting) layer. The EL layer is of an organic composition that emits light when current is applied. The switching transistor and the driving transistor are thin film transistors (or TFT's).

A plurality of conductive layers are used in an active matrix organic electroluminescent display device to form a gate line, a gate electrode, a data line, a source/drain electrodes for the TFT's, a power supply layer, an anode electrode, etc., wherein insulation layers such as gate insulation film, interlayer insulation film and passivation film is interposed between the conductive layers so that the conductive layers are electrically isolated from each other.

In an electroluminescent display device, it is preferable to form the conductive layers so that they all remain electrically isolated from each other and do not accidently short with one another. It is also preferable to construct the power supply line in such a fashion that all pixels within the matrix receive the same amount of power at the same voltage so that there is no voltage drop along the power supply line. In other words, the power supply line must be free of any voltage drops within the conductive power supply line. Further, it is preferable that the power supply line is formed so that it is sufficiently separated from the data, gate and other conductive lines to prevent the possibility of an accidental inline electrical short. Further, it is preferable that the structure for the electroluminescent display be efficiently produced, requiring as few process steps to make, to reduce the costs of manufacture. Therefore, when possible, it is desirable to combine process steps.

SUMMARY OF THE INVENTION

It is therefore an object of the present invention to provide an improved structure for an electroluminescent flat panel display device.

It is also an object of the present invention to provide an improved method for making an electroluminescent flat panel display device.

It is also an object of the present invention to provide a process for making an electroluminescent flat panel display that has fewer processing steps and thus reduces manufacturing costs.

It is further an object of the present invention to provide a structure for an electroluminescent flat panel display device that eliminates the possibility of forming an in-line short between the power supply line and other conductive lines within the device, such as the gate line and the data line.

It is yet another object of the present invention to provide a method for making an electroluminescent flat panel display device that eliminates the possibility of forming an in-line short between the power supply line and other conductive lines within the device, such as the gate line and the data line.

It is still an object of the present invention to provide a structure and a method for making the structure of an electroluminescent flat panel display device where each pixel of a matrix is supplied with power at the same voltage thus providing a uniformity of luminescence between pixels.

It is still another object of the present invention to a flat panel display capable of improving emission efficiency of an EL device, and a fabrication method thereof.

These and other objects can be achieved by electroluminescent device and method of making where the power supply line is disposed on a layer that is separate from the layers other conductive lines are disposed, such as the gate line and the data line, and where the power supply line is formed at the same time and on the same layer and of the same material as the anode electrode for the EL device, and where the material used for the power supply line and the electrodes of the EL device are carefully chosen.

In order to reduce the chances of the power supply line from accidently shorting with either the data line or the gate line, the power supply line is formed on a different layer and is made in a different process step than the layers where the data and the gate lines are formed. In order to provide for an efficient process for making, using as few steps as possible, the power supply line and the anode electrode for the EL device are formed simultaneously and of the same material and on the same insulating layer using a single deposition step and a single patterning step and etch step to produce both the power supply line and the anode electrode for the EL device.

Similarly, the data lines and the upper electrode for the capacitor are formed at the same time on the same layer. Also, the gate lines and the lower electrode of the capacitor are formed at the same time, on the same layer with a single deposition, patterning and etch step.

In the simultaneous formation of the power supply line and the anode electrode for the EL device, a material is used that has both a low resistance and a superior reflectivity. This material can be Au, Pt, Ni, Cr or a laminated film such as Ni/Al/Ni, Ag/ITO or Al/ITO where ITO is indium tin oxide. Preferably the material used has a work function of at least 4.5 eV. By using such a low resistance material in the power supply line, it can be better insured that each pixel or EL device serviced by the power supply line receives the same voltage as all the other pixels, and that there is little loss of power or voltage along the power supply lines. Since the anode electrode is not made of a transparent material, the cathode electrode (or upper electrode) and not the anode electrode for the EL device is preferably made of a transparent material such as ITO or IZO where IZO is indium zinc oxide thus resulting in front emitting structure. The cathode electrode maybe instead made out of a semitransmittive conductive material.

In preferred embodiments of the present invention, the power supply layer may have a grid shape in which pixel electrode is arranged in a cross-hatched or grid-shaped structure, or the power supply layer is formed in a line shape in which the power supply layer is arranged between pixel electrodes arranged in row or column, or the power supply layer has a surface electrode shape in which the power supply layer is formed on a whole surface of the substrate to be electrically separated from the pixel electrodes. These designs further reduce power and voltage losses on the power supply line and further ensure each pixel receives the same voltage.

Furthermore, the present invention provides a fabrication method where the power supply lines and the anode electrode for the EL device are formed simultaneously, the data line and the upper electrode of the capacitor are preferably formed simultaneously and the gate line and the lower electrode of the capacitor are preferably formed simultaneously.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
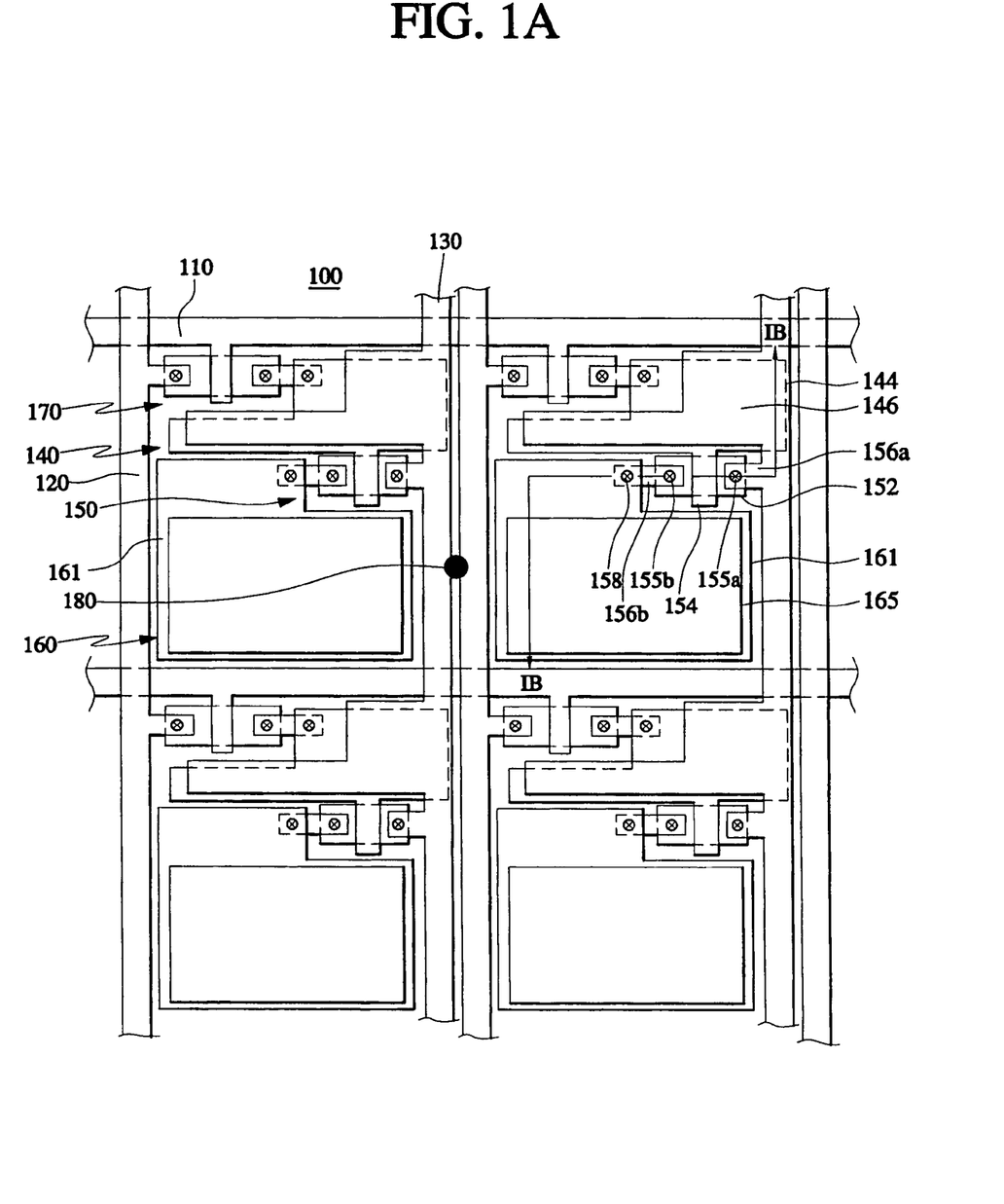
FIG. 1A is a plan view of an organic electroluminescent display device.

Turning to the figures, FIG. 1A illustrates plan view of an active matrix organic electroluminescent display device. Referring to FIG. 1A, an active matrix organic electroluminescent display device is made up of a plurality of gate lines 110, a plurality of data lines 120 and a plurality of power supply lines 130, and a plurality of pixels connected to the gate lines 110, data lines 120 and power supply lines 130.

Each of the pixels comprises two transistors (a driving TFT 150 and a switching TFT 170) and one capacitor 140 and an EL device 160. EL device 160 has an anode electrode (or pixel electrode) 161, a cathode electrode 164 and an organic emission layer 163 sandwiched between the anode electrode 161 and the cathode electrode 164. Each pixel includes a switching thin film transistor 170 connected to corresponding one of the plurality of gate lines 110 and corresponding one of the plurality of data lines 120, a driving thin film transistor 150 for driving the EL device 160 connected to corresponding one of the plurality of power supply lines 130, and a capacitor 140 for maintaining voltage between the gate and the source of the driving thin film transistor 150.

Figure 1B:
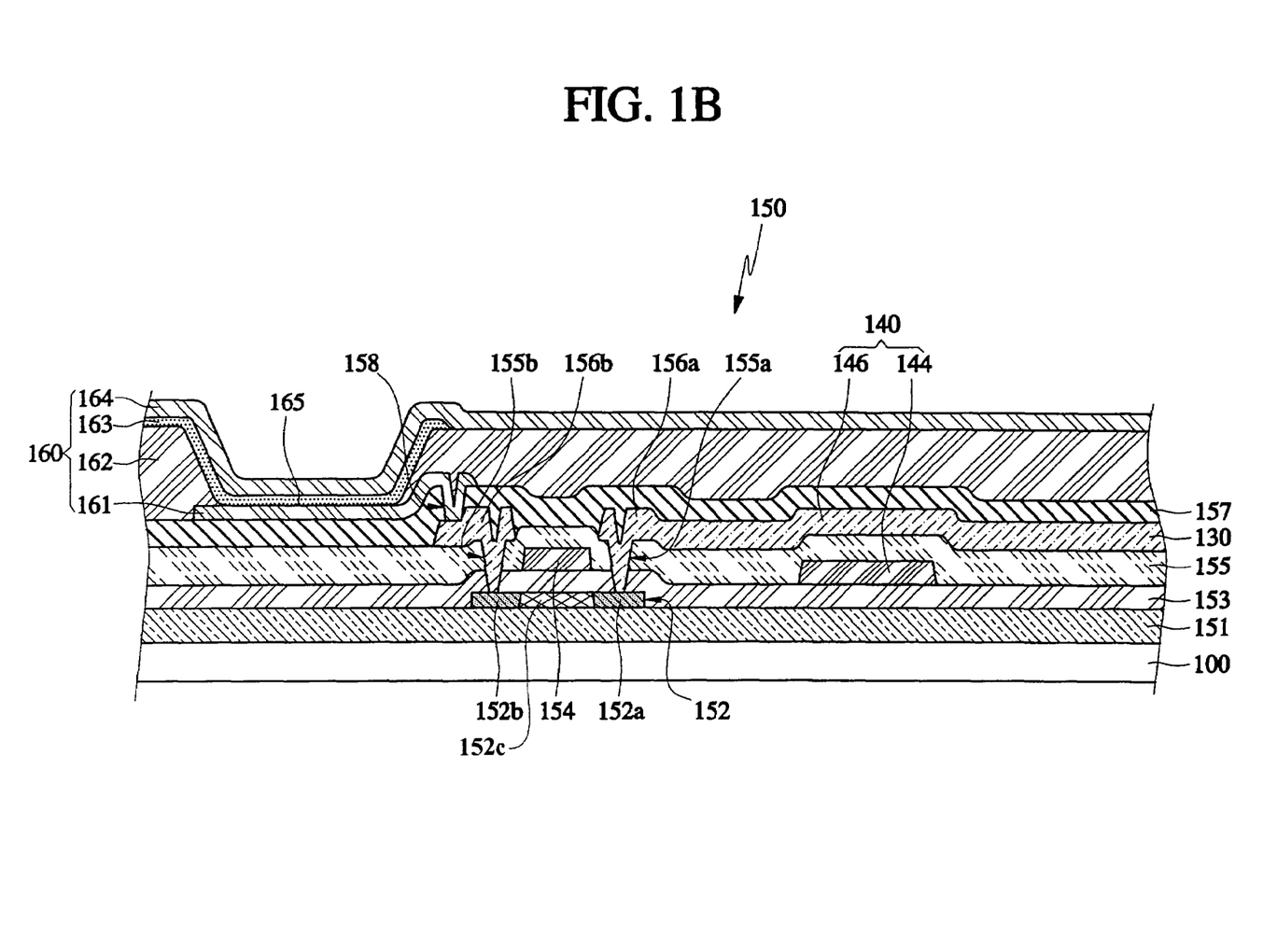
FIG. 1B is a cross sectional view of the organic electroluminescent display device of FIG. 1A, taken along a line IB-IB of FIG. 1A.

FIG. 1B illustrates cross sectional view taken along a line IB-IB of FIG. 1A. FIG. 1B is a cross sectional view for one pixel and is limited to illustration of the driving thin film transistor 150, the capacitor 140 and the EL device 160. Referring to FIG. 1B, a buffer layer 151 is formed on an insulation substrate 100, and the capacitor 140, the driving thin film transistor 150 and the EL device 160 are formed on the buffer layer 151. The capacitor 140 includes a lower electrode 144 formed on a gate insulation film 153 and an upper electrode 146 formed on an interlayer insulation film 155.

The driving thin film transistor 150 includes a semiconductor layer 152 including source/drain regions 152a and 152b, a channel forming region 152c formed between the source/drain regions 152a and 152b, formed on the buffer layer 151, a gate electrode 154 formed on the gate insulation film 153, and source/drain electrodes 156a and 156b formed on the interlayer insulation film 155. The source/drain electrodes 156a and 156b are electrically connected to the source/drain regions 152a and 152b respectively through contact holes 155a and 155b.

The EL device 160 is made up of an anode electrode 161 formed on a passivation film 157, an organic emission layer 163 formed on the anode electrode 161 inside an opening part 165, and a cathode electrode 164 formed on the organic emission layer 163 and the pixel defining layer 162. Pixel defining layer 162 is used to form the opening part 165. Pixel defining layer 162 is perforated to form opening 165 where the EL device 160 is formed.

In an active matrix organic electroluminescent display device, a power supply line 130 is connected to one of source/drain electrodes 156a and 156b of driving thin film transistor 150, (power supply line 130 being connected to source electrode 156a in FIG. 1B). Power supply line 130 is also electrically connected to the upper electrode 146 of the capacitor 140 to play a role of controlling current flowing to the anode electrode 161 of the EL device 160 through the driving thin film transistor 150 and via hole 158, wherein the power supply line 130 commonly supplies power voltage (Vdd) to each of a plurality of pixels in the matrix.

However, the power supply line 130 is often designed in such a way that often there is a substantial potential drop in the power supply line 130 before power is delivered to each pixel. This can lead to luminance nonuniformity throughout the matrix. In addition, the location of the power supply line, line width of the power supply line and position and number of pads connected to an external power source have an effect on design and fabrication process of thin film transistors.

Furthermore, the power supply line 130 together with the data line 120 are formed on the interlayer insulation film 155 so that the power supply line 130 is electrically separated from the data line 120 as illustrated in FIG. 1A, or the power supply line 130 together with the gate line 110 are formed on the gate insulation film 153 so that the power supply line 130 is separated from the gate line 110. Since the power supply line 130 is formed on the same layer as either the data line 120 or the gate line 110, there is a risk that an inline short 180 could occur between the power supply line 130 and the data line 120 or the gate line 110 with the designs of FIGS. 1A and 1B.

Figure 2A:
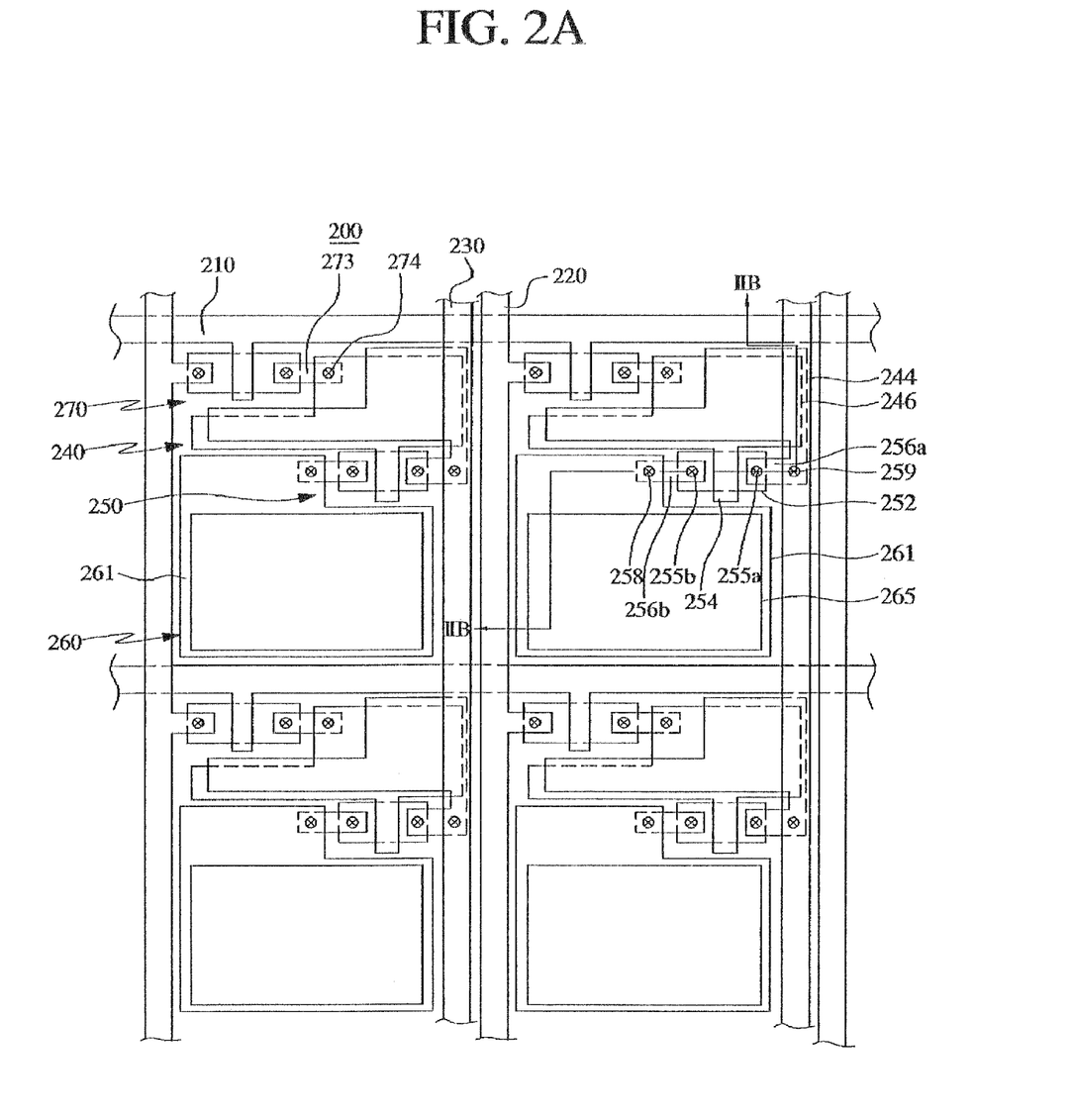
FIG. 2a is a plan view of an organic electroluminescent display device according to preferred embodiments of the present invention.
Figure 2B:
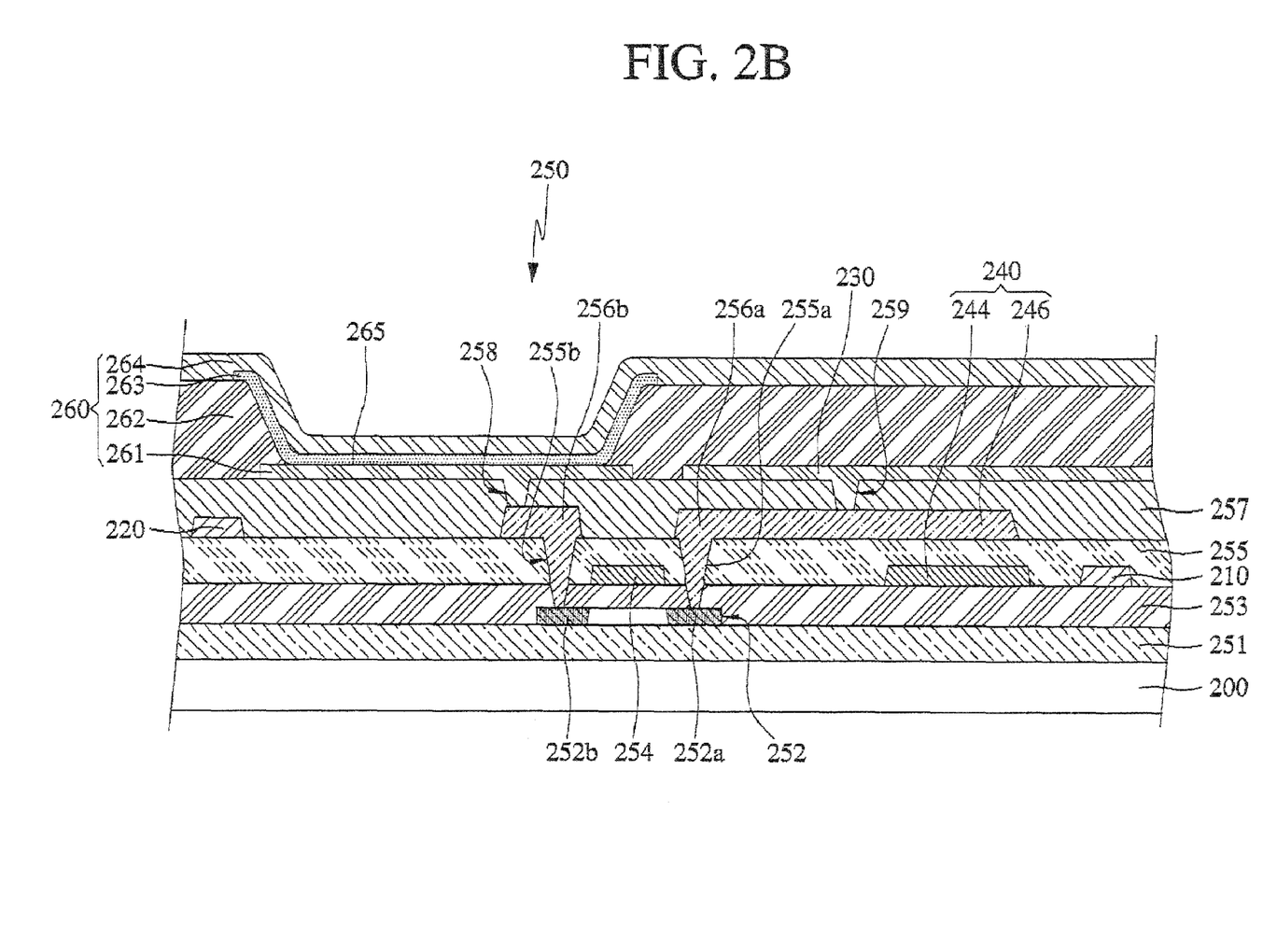
FIG. 2B is a cross sectional view of an organic electroluminescent display device taken along a line IIB-IIB of FIG. 2A.

FIG. 2A illustrates plan view of an active matrix organic electroluminescent display device according to preferred embodiments of the present invention, and FIG. 2B illustrates a cross sectional view of an active matrix organic electroluminescent display device, taken along a line IIB-IIB of FIG. 2A and is limited to illustration to a driving thin film transistor 250, an EL device 260 and a capacitor 240 in a pixel.

Referring to FIG. 2A and FIG. 2B, an active matrix organic electroluminescent display device is made up of a plurality of gate lines 210 formed on an insulation substrate 200, a plurality of data lines 220 formed on the insulation substrate 200 so that the data lines 220 and gate lines 210 cross each other, a power supply line 230 for supplying common power, and a plurality of pixels connected to the signal lines 210 and 220 and the power supply layer 230.

Each of the pixels includes a switching thin film transistor 270 connected to corresponding one of the gate lines 210 and corresponding one of data lines 220, a capacitor 240 connected to the power supply line 230 through a via hole 259, a driving thin film transistor 250 connected to the power supply line 230 through the via hole 259, and an EL device 260.

Upper and lower electrodes 246 and 244 of the capacitor 240 are formed in an island shape on and under an interlayer insulation film 255 respectively. The lower electrode 244 of capacitor 240 is connected to gate electrode 254 of the driving thin film transistor 250. Gate electrode 254 is also electrically connected to one of source/drain electrodes of the switching thin film transistor 270, for example, the drain electrode through a contact hole 274. The data line 220 is connected to the other of the source/drain electrodes of the switching thin film transistor 270, for example, the source electrode. The gate line 210 is connected to the gate electrode of the switching thin film transistor 270. The other end of the gate line 210 is connected to a scan driver outside the pixel array and the other end of the data line 220 is connected to a source driver outside the pixel array. The upper electrode 246 of capacitor 240 is electrically connected to the power supply line 230 through the via hole 259. A lower electrode 261 of the EL device 260 is formed on the same layer as the power supply line 230, for example, a passivation film 257 so that the lower electrode 261 of EL device 260 is connected to one of source/drain electrodes 256a and 256b of the driving thin film transistor 250 (lower electrode 261 is connected to the drain electrode 256b in FIG. 2B) through a via hole 258.

Further, an insulation layer such as an interlayer insulation film 255 is interposed between the gate lines 210 and data lines 220 so that the gate lines 210 and data lines 220 are electrically separated from each other. An insulation layer such as a gate insulation film 253 and the passivation film 257 is interposed between the power supply line 230 and the gate and data lines 210 and 220 respectively so that the power supply line 230 remains electrically isolated form the gate and data lines 210 and 220, respectively, to reduce or eliminate the chances of an in line short between the power supply line 230 and either of the gate line 210 or the data line 220. Therefore, the power supply line 230 is formed on the same layer as lower electrode, e.g., anode electrode or pixel electrode 261 of EL device 260. That is, both the power supply line 230 and the anode electrode 261 of EL device 260 are formed on the passivation film 257. Inline shorts are prevented since the power supply line 230 is formed on a layer different from the gate lines 210 or data lines 220.

A fabrication method of an active matrix organic electroluminescent display device of the present invention having the foregoing structure is described as follows. A buffer layer 251 is formed on an insulation substrate 200. Then, an amorphous silicon film is crystallized into a polysilicon film by performing an ordinary crystallization process such as excimer laser annealing (ELA) process after depositing the amorphous silicon film on the buffer layer 251. A semiconductor layer 252 is formed in an island shape by patterning the polysilicon film.

A gate insulation film 253 is formed on the buffer layer 251 and the previously formed semiconductor layer 252. Then, a gate electrode 254 is formed by patterning a gate electrode material deposited on the gate insulation film 253 after depositing the gate electrode material on the gate insulation film 253. The gate line 210 and the lower electrode 244 of the capacitor 240 are formed at the same time. Source/drain regions 252a and 252b of driving TFT transistor 250 are formed by ion implanting impurities of a predetermined conductivity type, for example, p type impurities into the semiconductor layer 252 after forming the gate electrode 254. Between the source and the drain regions 252a and 252b is a channel forming region 252c.

Contact holes 255a and 255b for exposing the source/drain regions 252a and 252b respectively of driving TFT 250 are formed by patterning the interlayer insulation film 255 after depositing the interlayer insulation film 255 on the lower electrode 244, the gate 254 and the gate insulation film 253. Contact holes 255a and 255b perforate interlayer insulation film 255. Source/drain electrodes 256a and 256b, which are electrically connected to the source/drain regions 252a and 252b of driving TFT 250 through the contact holes 255a and 255b, are formed by patterning a source/drain electrode material after depositing the source/drain electrode material on the interlayer insulation film 255 perforated by contact holes 255a and 255b. At this time, the data lines 220 and the upper electrode 246 of capacitor 240 are formed, preferably at the same time. Upper electrode 246 of capacitor 240 is disposed above lower electrode 244. Upper electrode 246 is electrically connected to the source electrode 256a of driving TFT 250. Although it is not illustrated in FIG. 2B, the switching transistor 270 is formed simultaneously with the fabrication process of the driving TFT 250.

Passivation layer 257 is formed over upper electrode 246 source electrode 256a, drain electrode 256b and interlayer insulation film 255. Passivation layer 257 is then simultaneously perforated by via hole 258 and via hole 259. Via hole 258 exposes one of the source/drain electrodes 256a and 256b, (drain electrode 256b illustrated in FIG. 2B) and the via hole 259 exposes the other one of the source/drain electrodes 256a and 256b (source electrode 256a illustrated in FIG. 2B).

Then, the material for the anode electrode 261, the power supply line 230, and the conductive material to fill via holes 258 and 259 to establish electrical contact with the drain 252b of driving TFT 250 and source 252a of driving TFT 250, respectively is then deposited on the perforated passivation film 257. This conductive material is then patterned and etched to form the anode electrode 261 and the power supply line 230.

The anode electrode (or pixel electrode) 261 and power supply line 230 are formed of a conductive material having larger work function compared with an electrode material for the cathode 264 to be formed later. The work function of anode electrode 261 and power supply line 230 is at least 4.5. Since the anode electrode 261 and power supply line 230 are formed of the same material, it is preferable to use a material having low resistivity to minimize voltage drop in the power supply line 230 and a material with superior reflectivity to increase reflectivity of EL emission layer 263 to be formed on anode electrode 261 in the next step. For example, the conductive material for the anode electrode 261 and power supply line 230 may be a single film such as Au, Pt, Ni, Cr, or a laminated film such as Ni/Al/Ni, Ag/ITO or Al/ITO.

As described above, problems of 1) voltage drop within power supply line 230 and 2) shorting between the power supply line 230 and either of the gate lines 210 or the data lines 220 can be overcome without additional process steps by 1) forming the power supply line 230 on a different layer than the gate and data lines and 2) by using a low resistive material for the power supply line 230.

In the instant structure and process, since the power supply line 230 and the anode electrode 261 of the EL device 260 are formed simultaneously, and since a low resistivity material is used that has superior reflectivity properties, the anode electrode 261 is therefore not made of a highly transparent material as in a rear emitting structure. The anode electrode 261 may however be made of a bi-layered film where one of the layers is transmitive and the other layer is reflective. The entire cathode 264 is made of a transparent material such as ITO or IZO or a semitransmittive conductive material so that EL device 261 is a front emitting structure and not a rear emitting structure. ITO and IZO have a relatively high resistance compared to the material used for the power supply line 230 and the anode electrode 261. Since the power supply line 230 and the anode electrode 261 are formed simultaneously of the same material, the high resistance transparent material is relegated to the cathode 264 of EL device 260 instead of the anode 261.

Figure 3A:
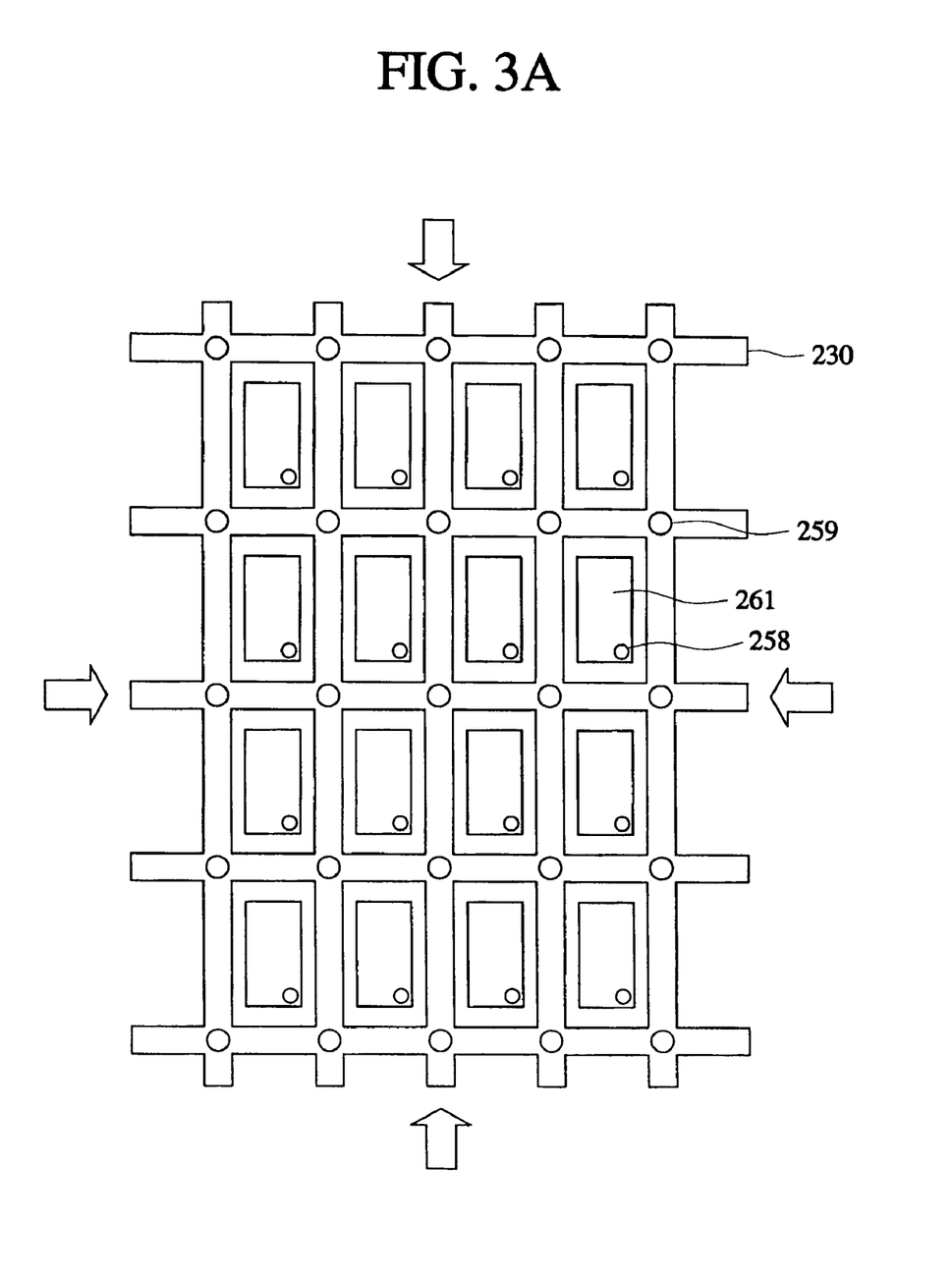
FIG. 3A and FIG. 3B are plan views of an power supply lines and a matrix of anode electrodes of an organic electroluminescent display device according to preferred embodiments of the present invention.
Figure 3B:
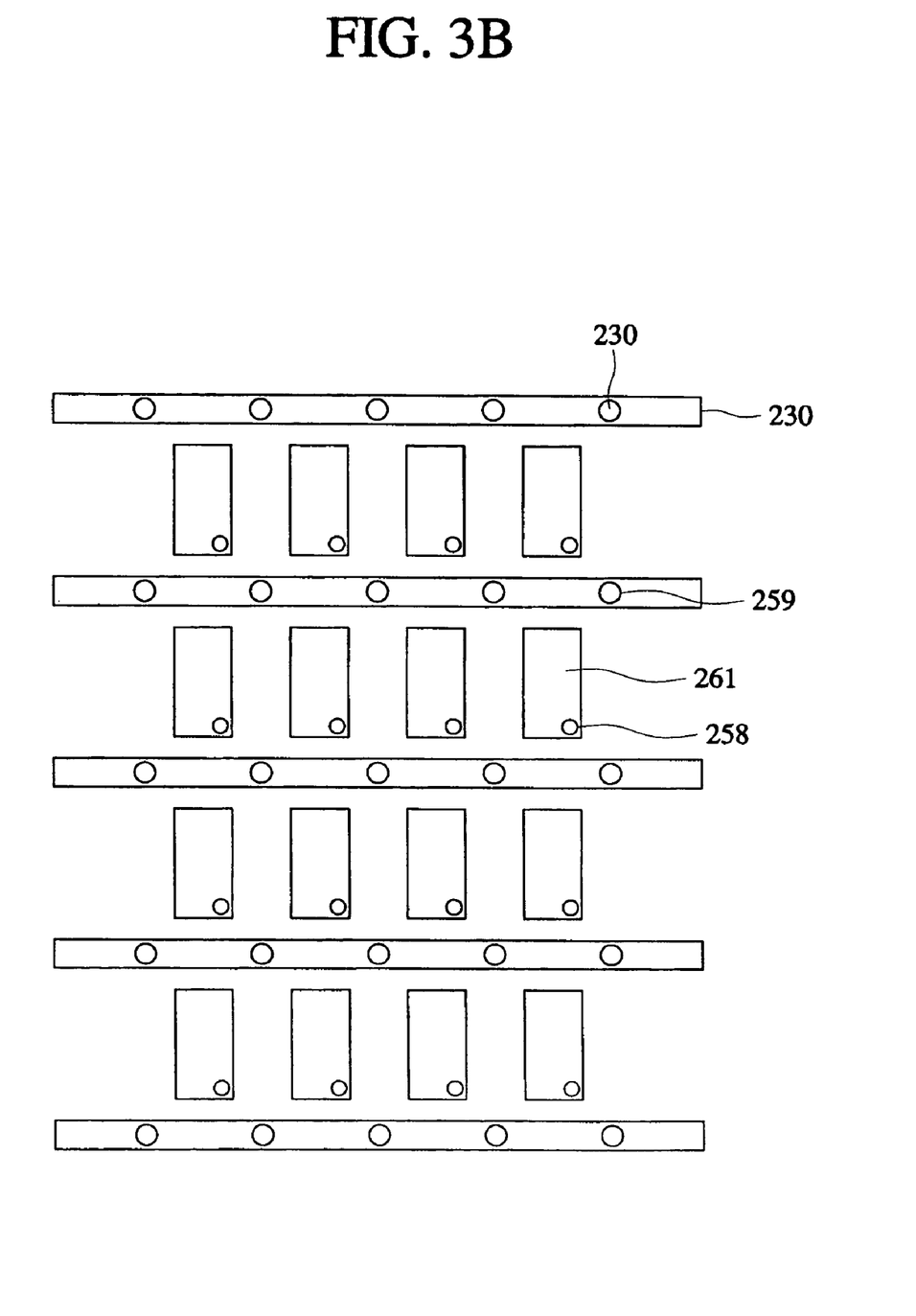

FIG. 3A and FIG. 3B illustrate plan views of the anode electrode 261 and power supply line 230 according to preferred embodiments of the present invention. In FIG. 3A, the power supply line 230 is formed in a grid shape, and the anode electrode 261 is formed in an island shape inside each grid of the power supply line 230, wherein voltage drop through the power supply line 230 can be reduced further more as power voltage (Vdd) is supplied from four directions (shown in arrow) in case that the power supply line 230 is formed in a grid shape. In other words, by having the power supply lines 230 of a grid structure with extra redundant lines, the voltage drop across the power supply line 230 is further reduced. This grid shape coupled with the use of a low resistivity material produce a power supply line 230 with little loss thus ensuring each pixel in the matrix will receive the same power and the same voltage from the power supply line 230 and thus providing uniform luminance between the pixels In FIG. 3B illustrates another structure for the power supply line 230. An island shaped anode electrode 261 is arranged in a matrix shape of column and row, and a line shaped power supply line 230 is arranged between neighboring anode electrodes 261 arranged in column. The power supply line 230 can be arranged not only between the neighboring anode electrodes 261 arranged in column as in FIG. 3A, but also between neighboring anode electrodes 261 arranged in row as in FIG. 3A.

It matters little to choose the power supply line of any structure within the range in which an opening ratio is not influenced since the power supply line 230 is formed on other insulation layer different from the gate lines 210 and data lines 220, for example, the passivation film 257 so that short problems between the power supply line 230 and the gate lines 210 or data lines 220 are excluded in preferred embodiments of the present invention. Therefore, the power supply line 230 may not only be formed in a grid and line shaped of FIG. 3A and FIG. 3B, but also in a surface electrode shape in which the power supply line 230 is electrically separated from the anode electrode 261 and connected to the upper electrode 246 of the capacitor 240 and one electrode out of the source/drain electrodes 256a and 256b, for example, the source electrode 256a of the thin film transistor 250 through the via hole 259.

After formation of the power supply line 230 and anode electrode 261, a pixel defining layer 262 is formed on the passivation film 257 including the anode electrode 261 and power supply line 230. Pixel defining layer 262 is perforated by an opening part 265 by etching the pixel defining layer 262 so that the anode electrode 261 is exposed. Sequentially, a cathode electrode 264 is formed on the substrate after forming an organic emission layer 263 on the anode electrode 261 of the opening part 265.

According to the foregoing preferred embodiments of the present invention, the anode electrode 261 and power supply line 230 are formed at the same time by using a material having low resistance and high reflectivity so as to reduce voltage drop of the power supply line 230 while limiting the number of process steps. The power supply line 230 is formed in such a way to prevent inline shorts between the data line 220 or gate line 210 and power supply line 230, while improving emission efficiency of the EL device. Furthermore, an organic electroluminescent display device according to preferred embodiments of the present invention has merits in that voltage drop of the power supply line 230 can be reduced more by forming the power supply line 230 in a grid shape as in FIG. 3A and by using a low resistivity material for the power supply line 230.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A flat panel display, comprising:
   a thin film transistor comprising source and drain electrodes, arranged on an insulation substrate;
   a gate insulation film arranged on the insulation substrate and on the thin film transistor, the gate insulation film being perforated by first and second contact holes exposing the source and drain electrodes respectively;
   a gate electrode, a lower electrode of a capacitor and gate lines being arranged on the gate insulation film;
   an interlayer insulation film arranged on the gate electrode, the lower electrode of the capacitor and the gate lines;
   an upper electrode of the capacitor and data lines being arranged on the interlayer insulation film;
   a passivation film arranged on the upper electrode of the capacitor and on the data lines
   a pixel electrode arranged on the passivation film and electrically connected to one of the source and drain electrodes through one of the first and second contact holes; and
   a power supply layer also arranged on the passivation film and electrically connected to the other one of the source and drain electrodes through the other one of the first and second contact holes.

2. The flat panel display of claim 1, the power supply layer and pixel electrode being comprised of the same material.

3. The flat panel display of claim 1, the power supply layer and pixel electrode being comprised of a material having both a low resistivity and a high reflectivity.

4. The flat panel display of claim 2, wherein the pixel electrode and the power supply layer being comprised of a single film of a material selected from the group consisting of Au, Pt, Ni, Cr, a laminated Ni/Al/Ni film, a laminated Ag/ITO film and a laminated Al/ITO film.

5. A flat panel display, comprising:
   an insulation substrate divided into a plurality of pixel regions, each of said pixel regions being defined by a crossing of a gate line and a data line, the insulation substrate comprising a plurality of thin film transistors, each thin film transistor being arranged in corresponding ones of said plurality of pixel regions;

a first insulation film arranged on the substrate and on the plurality of thin film transistors;

a gate electrode, gate lines and data lines arranged on the first insulation film;

a second insulation film arranged on the gate electrode, the gate lines and the data lines;

a plurality of pixel electrodes arranged on the second insulation film and being electrically connected to corresponding ones of said plurality of thin film transistors in corresponding ones of said plurality of pixel regions; and a power supply layer also arranged on the second insulation film, the power supply layer being electrically separated from the plurality of pixel electrodes, said power supply layer being electrically connected to each of the plurality of thin film transistors and supplying power to each of the plurality of thin film transistors.

6. The flat panel display of claim 5, an entirety of the power supply layer being separated from an entirety of each of the gate lines and the data lines by the second insulation film.

7. The flat panel display of claim 5, the power supply layer being formed in a line shape in which the power supply layer is arranged between corresponding ones of said plurality of pixel electrodes, said power supply layer being arranged in one of a row or a column.

8. The flat panel display of claim 5, the power supply layer having a surface electrode shape in which the power supply layer is formed on a whole surface of the substrate and being electrically separated from each of the plurality of pixel electrodes.

9. The flat panel display of claim 1, an entirety of the power supply layer being separated from an entirety of the data lines by the passivation film.

10. The flat panel display of claim 9, an entirety of the power supply layer being separated from an entirety of the gate lines by the passivation film and the interlayer insulation film.

11. The flat panel display of claim 5, wherein the power supply layer surrounds each of said plurality of pixel electrodes, the power supply layer comprises a plurality of electrodes extending in a first direction and a plurality of electrodes extending in a second direction intersecting the electrodes extending in the first direction.

* * * * *